United States Patent [19]

Pease et al.

[11] Patent Number: 4,567,505
[45] Date of Patent: Jan. 28, 1986

[54] HEAT SINK AND METHOD OF ATTACHING HEAT SINK TO A SEMICONDUCTOR INTEGRATED CIRCUIT AND THE LIKE

[75] Inventors: Roger F. Pease; David B. Tuckerman, both of Stanford; Richard M. Swanson, Los Altos, all of Calif.

[73] Assignee: The Board of Trustees of the Leland Stanford Junior University, Stanford, Calif.

[21] Appl. No.: 546,158

[22] Filed: Oct. 27, 1983

[51] Int. Cl.$^4$ ............................................. H01L 23/36
[52] U.S. Cl. .................. 357/81; 165/104.33; 165/185; 357/82
[58] Field of Search ................ 165/80 C, 104.33, 185; 357/65, 81, 82

[56] References Cited

U.S. PATENT DOCUMENTS

| | | | |
|---|---|---|---|
| 3,449,173 | 9/1965 | Rupprech et al. | 357/87 |
| 3,860,949 | 1/1975 | Stoeckert et al. | 357/65 |
| 4,080,722 | 3/1978 | Klatskin et al. | 357/68 |
| 4,126,879 | 11/1978 | Kessler, Jr. et al. | 165/80 C |
| 4,222,516 | 9/1980 | Badet et al. | 357/72 |
| 4,262,296 | 4/1981 | Shealy et al. | 357/55 |
| 4,450,472 | 5/1984 | Tuckerman et al. | 357/82 |
| 4,477,826 | 10/1984 | Oley | 357/65 |
| 4,489,570 | 12/1984 | Little | 165/185 |

FOREIGN PATENT DOCUMENTS 0009605 4/1980 Fed. Rep. of Germany ........ 357/82
1361875 4/1964 France ................................ 357/74

OTHER PUBLICATIONS

Tuckerman, D. B. and Pease, R. F. W., *High Performance Heat Sinking for VSLI*, IEEE Electron Device Letters, vol. EDL-2, No. 5 (May 1981).
Noth, R. W., *Heat Transfer from Silicon Chips and Wafers*, IBM Technical Disclosure Bulletin, vol. 17, No. 12, (May 1975).

*Primary Examiner*—William L. Sikes
*Assistant Examiner*—Vangelis Economou
*Attorney, Agent, or Firm*—Flehr, Hohbach, Test, Albritton & Herbert

[57] ABSTRACT

Two bodies such as an integrated circuit and a heat sink are maintained in a low stress and high thermal conductance abutment by pressure from capillary attraction. A surface of one of the bodies is provided with grooves preferably having reentrant surfaces. A surface of the other body is brought into abutment with the grooved surface with a liquid therebetween which partially fills the grooves. The grooves act as reservoirs for excess liquid so that a minimum thickness liquid interface is achieved, and the grooves enable trapped gas to escape out the open ends thereby preventing voids between the two bodies. Importantly, the groove geometry enforces a well-defined attractive force between the two surfaces due to the liquid surface tension.

12 Claims, 7 Drawing Figures

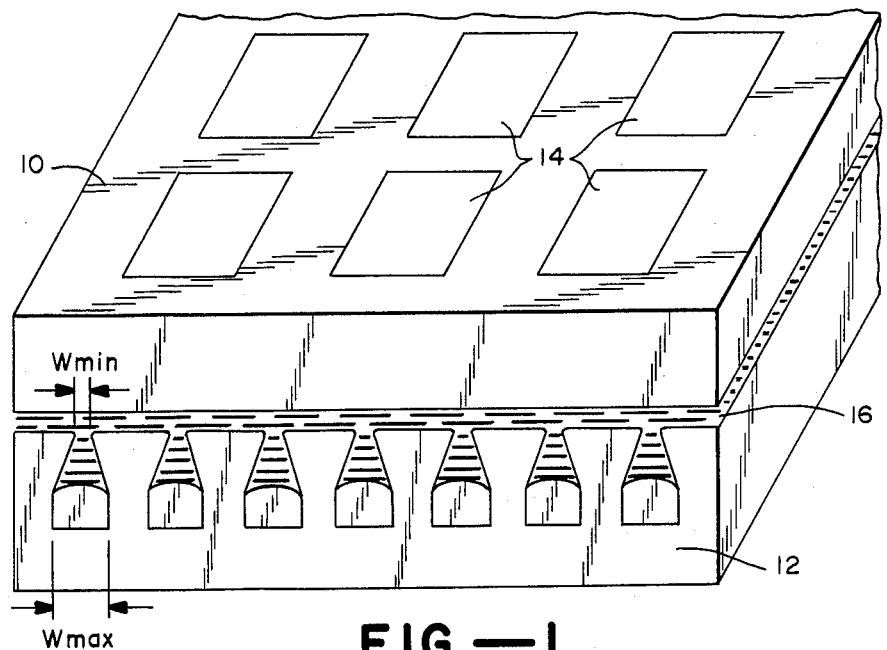
FIG.—1
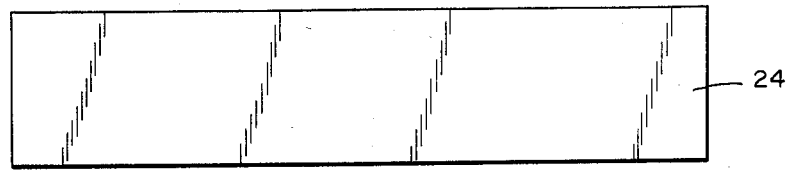
FIG.—2A
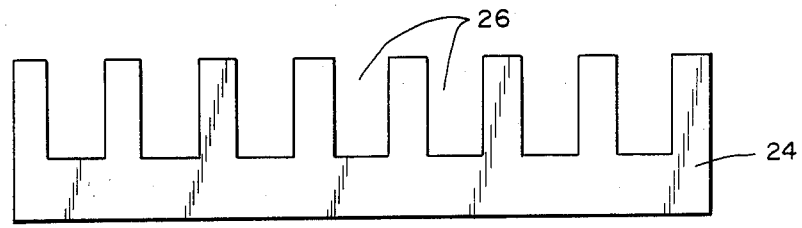
FIG.—2B
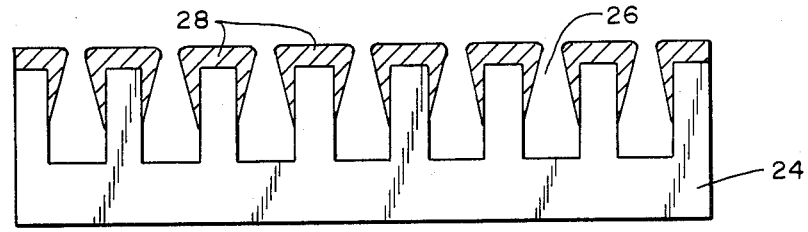
FIG.—2C

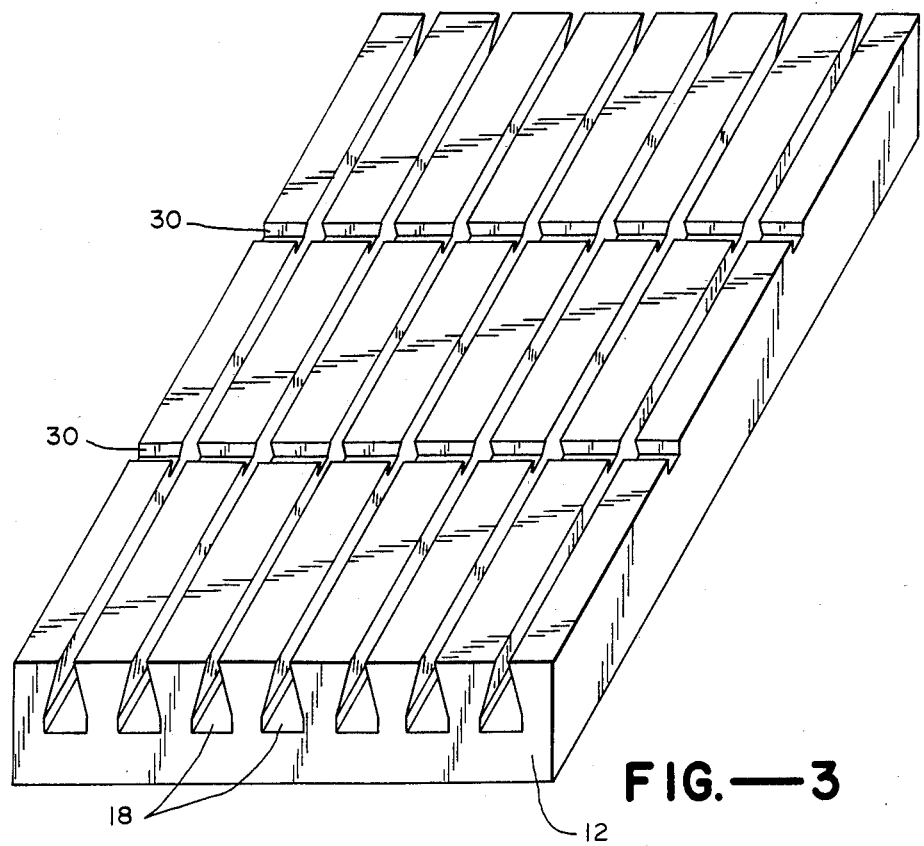
FIG.—3
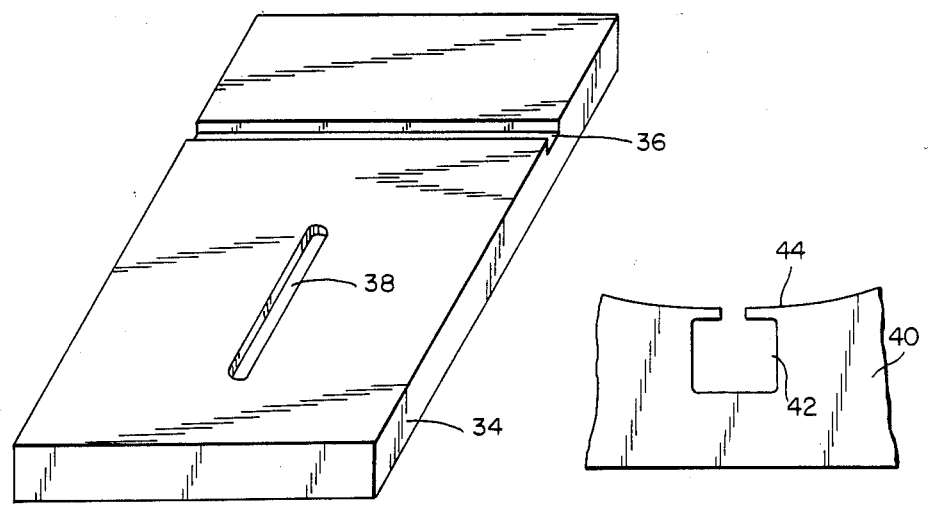
FIG.—4  FIG.—5

HEAT SINK AND METHOD OF ATTACHING HEAT SINK TO A SEMICONDUCTOR INTEGRATED CIRCUIT AND THE LIKE

This invention relates generally to heat generating devices and heat sinks therefor, and more particularly the invention relates to heat sinks for semiconductor integrated circuits and the like and a method of attaching heat sinks thereto.

Advances in semiconductor processing and circuit design have led to increased component density in very large scale integrated circuit arrays (VLSI). While the individual components making up such circuits operate at low voltage and draw very low currents, the increased density of components in such circuits has a consequential increase in heat generated for unit area of semiconductor chip surface. This has necessitated the use of heat sinks to facilitate removal of heat from the surface. Heretofore, heat conducting pedestals have been mounted on semiconductor chips and packages for heat removal to an air or fluid coolant. Proposals have been suggested for engaging the semiconductor chips directly with the coolant.

In copending application Ser. No. 06/239,407 filed Mar. 2, 1981 for METHOD AND MEANS FOR IMPROVED HEAT REMOVAL IN COMPACT SEMICONDUCTOR INTEGRATED CIRCUITS AND SIMILAR DEVICES, now U.S. Pat. No. 4,450,472 applicants describe a heat sink in which microscopic heat fins are provided in integral contact with a heat generating device such as a semiconductor chip and a coolant engages the fins in laminar flow for heat removal. The physical dimensions of the fins and channels are optimized for the particular material and coolant employed. In one preferred embodiment, a heat conducting body having a major surface includes microscopic fins in the major surface. A major surface of a semiconductor chip engages the major surface and microscopic fins of the heat conducting body thereby defining channels through which a coolant can flow in direct contact with the semiconductor chip.

The present invention is directed to an improved heat sink having microscopic channels which facilitate attachment of the heat sink to a heat generating body such as a semiconductor chip and the like. The microscopic channels provide reservoirs which are partially filled with an interfacial liquid whereby surface tension provides a continuous suction pressure between the heat sink and the heat generating body. The channels function as capillaries for receiving an interfacial liquid between the abutting faces of the semiconductor device and the heat sink. The capillary action of the grooves in receiving the interfacial liquid creates a substantial negative pressure which provides a uniform and conformal pressure contact between the semiconductor chip and the heat sink.

Preferably, the microscopic channels have reentrant surfaces. The reentrant shape of the microscopic grooves enables a stable hydrostatic equilibrium of partially filled grooves to exist; the fluid congregates at these narrow necks where the surfaces abut. The interfacial liquid preferably has a very low vapor pressure, good wetting characteristics (e.g. low contact angle), a wide operating temperature range, high surface tension, and a high thermal conductance with the heat sink and semiconductor material.

The chip and heat sink can be removed by applying a tensile force in excess of the surface tension force. In order to prevent unintended sliding of the two bodies during normal operating conditions, mating locating surfaces can be provided in the chip and heat sink surfaces. Accordingly, an object of the present invention is an improved heat sink for use with a semiconductor wafer and the like.

Another object of the invention is an improved method of attaching a heat sink to a heat generating body such as a semiconductor integrated circuit.

A further object of the invention is a method of attaching a heat sink which introduces very low mechanical stress.

Another object of the invention is a heat sink which is removable and reusable.

A feature of the invention is a heat sink having a plurality of grooves which provide reservoirs for an interfacial liquid.

The invention and objects and features thereof will be more readily apparent from the following detailed description and appended claims when taken with the drawing, in which:

FIG. 1 is a perspective view of a semiconductor circuit and heat sink in accordance with one embodiment of the present invention.

FIGS. 2A-2C are side views in section illustrating the steps in fabricating the heat sink of FIG. 1.

FIG. 3 is a perspective view of a heat sink in accordance with one embodiment of the invention.

FIG. 4 is a perspective view of a heat sink illustrating locating surfaces in accordance with one embodiment of the invention.

FIG. 5 is a side elevation in section of a portion of a heat sink illustrating another embodiment of the invention.

Referring now to the drawing, FIG. 1 is a perspective view illustrating a semiconductor integrated circuit 10 and a heat sink 12 in accordance with one embodiment of the present invention. The integrated circuit 10 comprises a single crystal semiconductor material such as silicon having a major surface in which circuit components shown generally at 14 are formed. The opposite surface of the integrated circuit 10 mates with a major surface of the heat sink 12 with a liquid 16 functioning as a thermal interface medium therebetween. The mating surface of the heat sink 12 includes a set of long, parallel, and open ended microscopic reentrant capillaries 18 which are partially filled with the thermal interface liquid medium 16. The heat sink 12 preferably comprises a material having high thermal conductance, such as silicon, in which the microscopic capillaries 18 can be formed, as will be described further hereinbelow with reference to FIGS. 2A-2C.

The thermal interface medium preferably has low vapor pressure, good wetting characteristics with the materials of the integrated circuit 10 and the heat sink 12, a wide operating temperature range, high surface tension, and high thermal conductance. Silicone oil has proved to be satisfactory.

In one embodiment the capillaries have a minimum width, $W_{min}$, of one micron at the top and a maximum width, $W_{max}$, of five microns near the bottom with the depth of the capillaries being on the order of 30 microns.

In assembling the integrated circuit wafer 10 (as used herein chip and wafer are synonymous) and the heat sink 12, the interface liquid medium is applied on the surface of the semiconductor chip in an amount to assure that not all of the grooves in the heat sink can be completely filled. This control can be achieved, for example, by spinning off excess liquid. The grooved surface of the heat sink 12 is brought into contact with the wet surface of the semiconductor wafer, and the liquid medium partially fills the grooves 18 in the heat sink. Importantly, the grooves provide a capillary action when the liquid wets the walls of the groove, thereby establishing a strong suction pressure. The suction pressure is given by $$P = T/r$$

where r is the radius of curvature of the liquid meniscus in the grooves and T is the liquid surface tension. In the case of a liquid metal (e.g. T=500 hynes/cm) in a 2 micron wide groove with perfect wetting, the suction force will be 5 atmospheres. Such a pressure can elastically deform the chip into very close contact with the package surface and maintain this contact during thermal cycling, depending on the chip thickness, polish and planarity. The chip should be thin enough to allow sufficient deformation by the capillary suction action to enable close proximity (typically submicron) of the chip surface and the heat sink surface. Preferably, the generally planar grooved surface of the heat sink is slightly concave thereby facilitating maximum contact with the semiconductor wafer by flexing thereof. The width of the capillary at the meniscus is preferably greater than the maximum spacing between the heat sink and the semiconductor chip.

As used herein, "reentrant" means that the channels are wider near the bottom than near the top such as, for example, a dovetail or teardrop shape. The reentrant grooves can have a gradual taper or an abrupt taper. This enables a stable hydrostatic equilibrium of partially filled grooves to exist in which the majority of liquid congregate, near the interface where the grooves are narrowest. If one groove draws an excess of liquid, the meniscus radius of curvature will increase thereby reducing the suction pressure in comparison with its neighbors and thus causing the groove to expel liquid. Occasional tunnels between adjacent grooves may be provided to ensure free distribution and equilibrium of the liquid and thereby provide uniform hydrostatic tension. The partially filled grooves also allow the escape of trapped gas when the integrated circuit chip and heat sink are first brought into contact. Thus, large voids between the two bodies are prevented and increased heat transfer therebetween is provided. Referring now to FIGS. 2A-2C, side views in section of a heat sink body illustrate the steps in fabricating the microscopic channels having reentrant surfaces in accordance with one embodiment.

In FIG. 2A, a single crystal silicon wafer 24 is provided which has a major surface with a <110> crystalline orientation. In FIG. 2B the <110> surface of the silicon wafer 24 is anisotripically etched using a mask and an etchant such as potassium hydroxide as is conventional in semiconductor wafer processing. The anistropic etch forms vertical walled grooves 26 with a depth on the order of 30 microns and a width of 5 microns.

In FIG. 2C the grooves are electrolessly plated with nickel 28 which partially fills the grooves 26, thereby forming the reentrant surfaces of the capillaries. The nickel coating also functions in protecting the silicon microgrooves from fracture since localized concentrations of stress are absorbed by plastic deformation of the nickel.

FIG. 3 is a perspective view of the heat sink of FIG. 1 which further illustrates the plurality of grooves 18 formed in the major surface of the body. In order to insure free distribution and equilibrium of the interface liquid, tunnels 30 are etched in the surface of the heat conducting body 12 thereby interconnecting the plurality of grooves 18. The grooves 30 may have reentrant surfaces similar to the grooves 18.

While the retaining pressure between the heat generating substrate wafer and the heat sink provided by the partially filled capillaries maintains the two bodies in intimate contact, the substrate can be readily removed from the heat sink by sliding action. To prevent accidental sliding of the heat generating substrate from the heat sink, locating surfaces can be formed in the heat sink as illustrated in FIG. 4. The substrate 34 has a groove 36 which receives a mating notch on the opposing substrate. A groove 38 is provided at generally a right angle with respect to groove 36 and may receive a projecting nipple from the opposing substrate. Importantly, this arrangement of locating surfaces will not constrain unequal thermal expansion of the two substrates.

FIG. 5 is a side elevation view of a portion of a heat sink 40 which illustrates another configuration of the reentrant capillaries 42. The generally planar surface 44 of heat sink 40 is slightly concave. The curvature is exaggerated in FIG. 5 for purposes of illustration only.

The use of partially filled grooves having microscopic reentrant surfaces provides a sufficient holding force for joining two surfaces in a high thermal conductance, conformal, low stress, and recycleable bond. The invention has applicability not only for integrated circuits and heat sinks but also as a capillary suction chuck to provide excellent heat transfer in a vacuum environment such as found in I.C. fabrication processing. While silicone oil has proved to be advantageous in bonding a semiconductor substrate to a heat sink, other materials such as a liquid metal or an uncured epoxy can be used as the interfacial material. In accordance with another aspect of the invention, a molten solder or uncured epoxy will be uniformly distributed without large voids between two surfaces due to the capillary action, and thereafter the solder can be cooled or the epoxy can be cured to effect an improved permanent bond. Advantageously, a gaseous flux can be provided uniformly through the grooves to uniformly interface and interact with the molten solder.

Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A combination comprising
   a first body having a major generally planar surface,
   a second body having a major generally planar surface, said surface of said second body having a first plurality of microscopic grooves therein, each groove having reentrant surfaces and providing a liquid reservoir, and
   a liquid material which partially fills and wets the groove surfaces and said major surfaces, said major surface of said first body being in abutment with said major surface of said second body with said fluid material being therebetween and partially filling said grooves and thereby maintaining said major surfaces in abutment.

2. The combination as defined by claim 1 in which one of said bodies is a heat sink and heat is conducted across the abutting interface between said bodies.

3. The combination as defined by claim 2 wherein said first body comprises a heat sink and said second body comprises an integrated circuit.

4. The combination as defined by claim 2 wherein said first body comprises an integrated circuit and said second body comprises a heat sink.

5. The combination as defined by claim 4 wherein said integrated circuit comprises a silicon substrate.

6. The combination as defined by claim 5 wherein said heat sink comprises a silicon substrate and said fluid material comprises silicone oil.

7. The combination as defined by claim 6 wherein said grooves comprise etched regions in said heat sink silicon substrate and a material formed on said major surface of said silicon substrate and on portions of walls of said grooves.

8. The combination as defined by claim 7 wherein said material comprises nickel.

9. The combination as defined by claim 5 wherein said major surface of said second body is concave and said integrated circuit silicon substrate is flexible.

10. The combination as defined by claim 1 wherein said major surface of said second body includes a second plurality of grooves which intersect said first plurality of grooves to facilitate the distribution of fluid in said first plurality of grooves.

11. The combination as defined by claim 1 wherein said major surface of said second body includes locating surfaces and said major surface of said first body includes mating locating surfaces for retaining said first body and said second body in alignment.

12. The combination as defined by claim 1 and further including an applied flux transported via the grooves to promote wetting and subsequent adhesion of the abutting surfaces of both bodies.

* * * * *